(12) United States Patent
Kwon et al.

(10) Patent No.: US 7,811,937 B2
(45) Date of Patent: Oct. 12, 2010

(54) APPARATUS AND METHOD OF FABRICATING THIN FILM TRANSISTOR ARRAY SUBSTRATE

(75) Inventors: Ob Nam Kwon, Yongin-si (KR); Heung Lyul Cho, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 883 days.

(21) Appl. No.: 10/960,918

(22) Filed: Oct. 12, 2004

(65) Prior Publication Data
US 2005/0079449 A1    Apr. 14, 2005

(30) Foreign Application Priority Data
Oct. 13, 2003    (KR) ............... 10-2003-0071082

(51) Int. Cl.
*H01L 21/36* (2006.01)
(52) U.S. Cl. ............... 438/694; 257/E21.441; 438/158
(58) Field of Classification Search ........ 438/694, 438/158; 257/E21.441
See application file for complete search history.

(56) References Cited

U.S. PATENT DOCUMENTS

| | | | | |
|---|---|---|---|---|
| 5,570,660 A | * | 11/1996 | Vandenberg | 122/379 |
| 6,008,877 A | * | 12/1999 | Akiyama et al. | 349/147 |
| 2001/0028071 A1 | * | 10/2001 | Yoo et al. | 257/250 |
| 2002/0092548 A1 | * | 7/2002 | Park | 134/61 |
| 2003/0085195 A1 | * | 5/2003 | Lee et al. | 216/23 |
| 2003/0111098 A1 | * | 6/2003 | Kim | 134/26 |
| 2003/0117539 A1 | * | 6/2003 | Hwang et al. | 349/43 |
| 2004/0114652 A1 | * | 6/2004 | Yoshikawa | 372/46 |

FOREIGN PATENT DOCUMENTS

| | | |
|---|---|---|
| KR | 10-0230625 | 8/1999 |
| KR | 10-2003-00268222 A | 3/2003 |

* cited by examiner

*Primary Examiner*—Lex Malsawma
*Assistant Examiner*—Elias Ullah
(74) *Attorney, Agent, or Firm*—McKenna Long & Aldridge LLP

(57) ABSTRACT

The present invention relates to an apparatus and a method of fabricating a thin film transistor array substrate. The apparatus includes a dip strip component for stripping a photo-resist pattern and a thin film formed on a substrate by using a stripper; a removing part for removing residual photo-resist and thin film from the substrate; and a jet strip component for jetting the stripper to remove residual particles of photo-resist and thin film left on the substrate. The method of fabricating includes dipping a substrate in a stripper, wherein the substrate has a photo-resist pattern and a thin film, the thin film being formed on an entire surface of the substrate so as to cover the photo-resist pattern; removing residual photo-resist and thin film using the stripper; and removing particles of residual photo-resist and thin film left on the substrate.

3 Claims, 22 Drawing Sheets

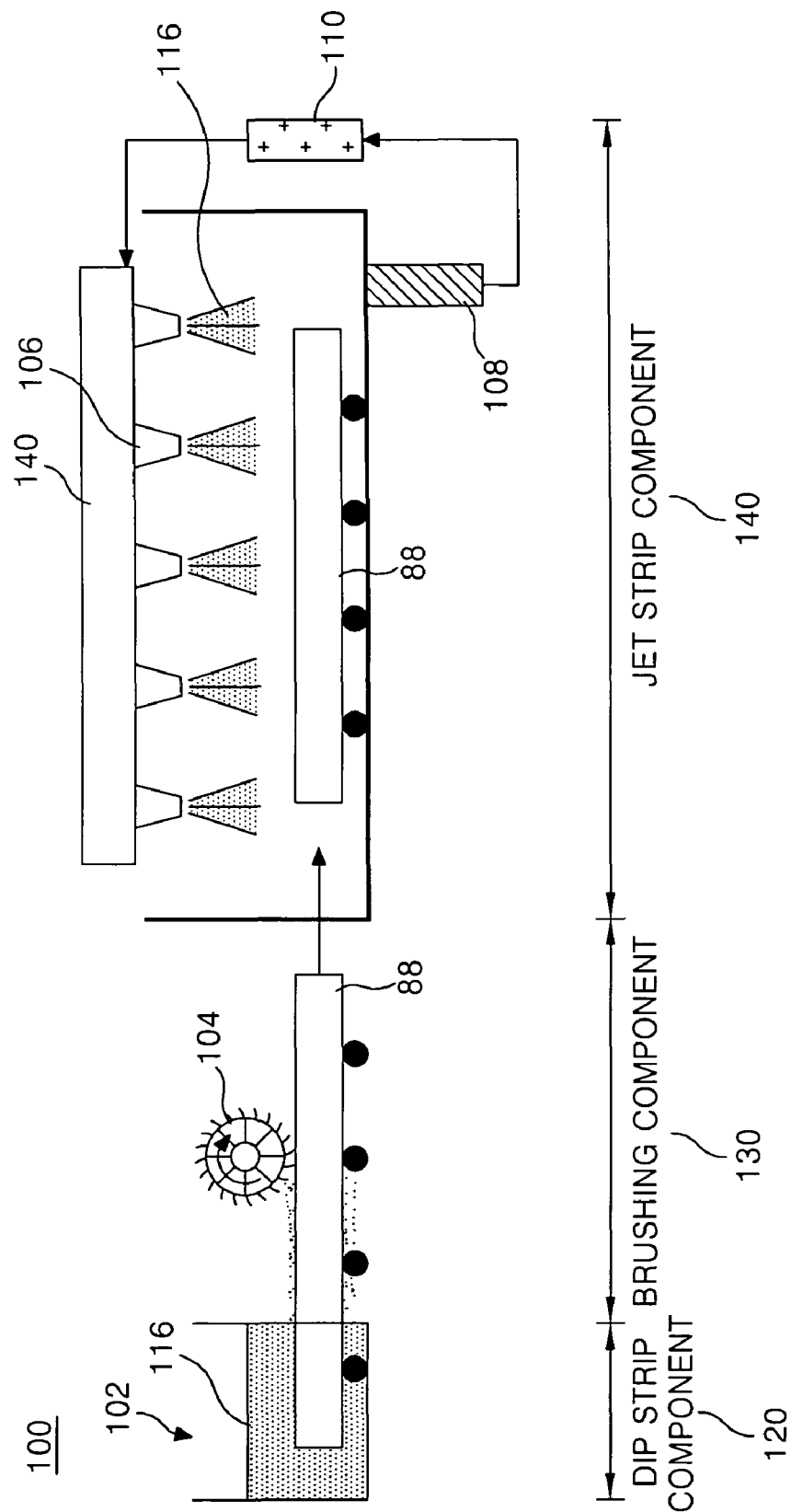

Before Lift-off

After Lift-off

APPARATUS AND METHOD OF FABRICATING THIN FILM TRANSISTOR ARRAY SUBSTRATE

This application claims the benefit of Korean Patent Application No. P2003-71082 filed on Oct. 13, 2003, which is hereby incorporated by reference for all purposes as if fully set forth herein.

BACKGROUND OF THE INVENTION

1. Field of the Invention

The present invention relates to an apparatus and a method of fabricating a thin film transistor array substrate, and more particularly, to an apparatus and a method of fabricating a thin film transistor array substrate capable of simplifying a fabricating process, reducing a cost and improving productivity.

2. Discussion of the Related Art

In general, a liquid crystal display device represents an image by means of adjusting a transmittance of a liquid crystal material using an electric field. For this purpose, the liquid crystal display device includes a liquid crystal display panel in which the liquid crystal cells are arranged in a matrix pattern, and a driving circuit for driving the liquid crystal display panel.

The liquid crystal display panel includes a thin film transistor array substrate and a color filter array substrate facing each other, a spacer located for fixedly maintaining a cell gap between the two substrates and a liquid crystal injected into the cell gap.

The thin film transistor array substrate includes gate lines and data lines, a thin film transistor formed as a switching device at every crossing of the gate lines and the data lines, a pixel electrode connected to the thin film transistor for each liquid crystal cell, and an alignment film applied to the substrate. The gate lines and the data lines receive signals from the driving circuits through each of their respective pad parts. The thin film transistor, in response to a scan signal supplied to a gate line, supplies to the pixel electrode a pixel voltage signal applied to the data line.

The color filter array substrate includes a color filter formed to correspond to the liquid crystal cells, a black matrix for reflecting external light and separating between the color filters, a common electrode for commonly supplying a reference voltage to the liquid crystal cells, and an alignment film applied to the substrate.

The liquid crystal display panel is fabricated by combining the thin film transistor array substrate and the color filter array substrate which are separately manufactured, injecting the liquid crystal material between the substrates, and sealing the substrates having the liquid crystal material between them.

In such a liquid crystal display device, thin film transistor array substrate fabrication involves a semiconductor process and requires a plurality of mask processes, which complicates the manufacturing process. This is a major factor in the manufacturing cost of the liquid crystal display panel. In order to solve this, a thin film transistor array substrate has been developed with a goal of reducing the number of mask processes. This is because one mask process includes a plurality of sub-processes such as thin film deposition, cleaning, photo-lithography, etching, photo-resist stripping, inspection processes and the like. Recent development efforts have resulted in a four-round mask process that eliminated one mask process from an existing five-round standard mask process.

FIG. 1 is a plan view illustrating a part of the related art thin film transistor array substrate, and FIG. 2 is a sectional view illustrating the thin film transistor array substrate taken along line I-I' in FIG. 1.

The thin film transistor array substrate, illustrated in FIG. 1 and FIG. 2, includes gate lines 2 and data lines 4 crossing with each other and having a gate insulating film 44 between them on a lower substrate 42, a thin film transistor 6 formed at every crossing, and a pixel electrode 18 formed in the cell region substantially defined by the crossing of the gate lines 2 and data lines 4. Further, the thin film transistor array substrate includes a storage capacitor 20 formed at an overlapped part of the pixel electrode 18, a pre-stage gate line 2, a gate pad part 26 connected to the gate line 2, and a data pad part 34 connected to the data line 4.

The thin film transistor 6 includes a gate electrode 8 connected to the gate line 2, a source electrode 10 connected to the data line 4, a drain electrode 12 connected to a pixel electrode 18, and an active layer 14 of semiconductor pattern 47, which defines a channel between the source electrode 10 and the drain electrode 12 and overlapping the gate electrode 8. Referring to FIG. 2, the active layer 14 overlaps with a lower data pad electrode 36, a storage electrode 22, the data line 4, the source electrode 10 and the drain electrode 12, and further includes a channel portion defined between the source electrode 10 and the drain electrode 12. An ohmic contact layer 48 of the semiconductor pattern 47 for making an ohmic contact with the lower data pad electrode 36, the storage electrode 22, the data line 4, the source electrode 10, the drain electrode 12 are further formed on the active layer 14. The thin film transistor 6, in response to the gate signal supplied to the gate line 2, applies a pixel voltage signal supplied to the data line 4 to the pixel electrode 18.

The pixel electrode 18 is generally connected to the drain electrode 12 of the thin film transistor 6 via a first contact hole 16 passing through a passivation film 50. The pixel electrode 18 generates a potential difference along with the common electrode formed on the upper substrate (not shown) when a pixel voltage is applied to the electrode. By this potential difference, the liquid crystal molecules located between the thin film transistor substrate and the upper substrate rotate due to the molecules' dielectric anisotropy, and make incident light through the pixel electrode 18 from the light source (not shown) transmit to the upper substrate.

The storage capacitor 20 includes a pre-stage gate line 2; a storage electrode 22 overlapping the pre-stage gate line 2 with a gate insulating film 44; the active layer 14 and the ohmic contact layer 48 between the active layer 14 and the storage electrode 22. The pixel electrode 18, which connects to the storage electrode 22 through contact hole 24, is formed on the passivation film 50 and overlaps the storage electrode 22. The storage capacitor 20 substantially maintains the pixel voltage applied to the pixel electrode 18 until a next pixel voltage is applied.

The gate line 2 is connected to a gate driver (not shown) through the gate pad part 26. The gate pad part 26 includes a lower gate pad electrode 28 extending from the gate line 2 and an upper gate pad electrode 32 connected to the lower gate pad electrode 28 via a third contact hole 30 passing through both of the gate insulating film 44 and the passivation film 50.

The data line 4 is connected to the data driver (not shown) through the data pad part 34. The data pad part 34 includes the lower data pad electrode 36 extending from the data line 4 and an upper data pad electrode 40 connected to the lower data pad electrode 36 via a fourth contact hole 38 passing through the passivation film 50.

The thin film transistor substrate having the above-mentioned configuration is formed through the use of the four-round mask process, according to the related art.

FIGS. 3A to 3D are sectional views sequentially illustrating a method of manufacturing the thin film transistor substrate.

Referring to FIG. 3A, the gate line 2, the gate electrode 8 and the lower gate pad electrode 28 are formed on the lower substrate 42.

A gate metal layer is formed on the lower substrate 42 by a deposition method such as a sputtering method. Subsequently, the gate metal layer is then patterned by a photolithography using a first mask and an etching process to thereby form gate patterns including the gate line 2, the gate electrode 8 and the lower gate pad electrode 28. A gate metal, which may include a chrome (Cr), a molybdenum (Mo), an aluminium (Al) and the like are used in the form of a single-layer structure or a double-layer structure.

Referring to FIG. 3B, the gate insulating film 44, the active layer 14, the ohmic contact layer 48 and source/drain patterns are sequentially formed on the lower substrate 42 provided with the gate patterns.

The gate insulating film 44, an amorphous silicon layer, a $n^+$ amorphous silicon layer and a source/drain metal layer are sequentially formed on the lower substrate 42 having the gate patterns thereon by a deposition technique such as plasma enhanced chemical vapor deposition (PECVD) or sputtering.

A photo-resist pattern is formed on the source/drain metal layer by a photolithography process using a second mask. In this case, the second mask employs a diffractive exposure mask having a diffractive exposing part wherein the diffractive exposing part corresponds to a channel portion of the thin film transistor. As a result, a photo-resist pattern of the channel portion has a lower height than a photo resist pattern of the source/drain pattern part.

Subsequently, the source/drain metal layer is then patterned by a wet etching process using the photo-resist pattern, to thereby form source/drain patterns including the data line 4, the source electrode 10, the drain electrode 12 being integral to the source electrode 10 and the storage electrode 22.

Next, the amorphous silicon layer and the $n^+$ amorphous silicon layer are patterned at the same time by a dry etching process using the same photo-resist pattern to thereby form the semiconductor pattern 47 including the ohmic contact layer 48 and the active layer 14.

The photo-resist pattern having a relatively low height in the channel portion is removed by an ashing process and thereafter the source/drain pattern and the ohmic contact layer 48 of the channel portion are etched by a dry etching process. Accordingly, the active layer 14 of the channel portion is exposed to separate the source electrode 10 from the drain electrode 12.

Thereafter, a remainder of the photo-resist pattern left on the source/drain pattern is removed using a stripping process.

The gate insulating film 44 is made of an inorganic insulating material such as silicon oxide ($SiO_x$) or silicon nitride ($SiN_x$). A metal for the source/drain pattern includes a molybdenum (Mo), a titanium (Ti), tantalum (Ta), Mo alloy, or the like.

Referring to FIG. 3C, the passivation film 50 includes first to fourth contact holes 16, 24, 30 and 38, which are formed on the gate insulating film 44 having the source/drain patterns.

The passivation film 50 is entirely formed on the gate insulating film 44 having the source/drain patterns by a deposition technique such as a plasma enhanced chemical vapor deposition (PECVD). The passivation film 50 is patterned by photolithography using a third mask and an etching process to thereby form the first to fourth contact holes 16, 24, 30 and 38. The first contact hole 16 is formed in such a manner to pass through the passivation film 50 and expose the drain electrode 12, whereas the second contact hole 24 is formed in such a manner to pass through the passivation film 50 and expose the storage electrode 22. The third contact hole 30 is formed in such a manner to pass through the passivation film 50 and the gate insulating film 44 and expose the lower gate pad electrode 28. The fourth contact hole 38 is formed in such a manner to pass through the passivation film 50 and expose the lower data pad electrode 36.

The passivation film 50 is generally made of an inorganic insulating material such as a material of the gate insulating film 44 or an organic insulating material having a small dielectric constant such as an acrylic organic compound, BCB (benzocyclobutene) or PFCB (perfluorocyclobutane).

Referring to FIG. 3D, transparent electrode patterns are formed on the passivation film 50. More specifically, a transparent electrode material is entirely deposited on the passivation film 50 by a deposition technique such as sputtering and the like. Then, the transparent electrode material is patterned by a photolithography using a fourth mask and an etching process, to thereby provide the transparent electrode patterns including the pixel electrode 18, the upper gate pad electrode 32 and the upper data pad electrode 40. The pixel electrode 18 is electrically connected, via the first contact hole 16, to the drain electrode 12 and is electrically connected, via the second contact hole 24, to the storage electrode 22 overlapping a pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. The transparent electrode material may be made of an indium-tin-oxide (ITO), a tin-oxide (TO) or an indium-zinc-oxide (IZO).

As described above, the related art thin film transistor array substrate and the manufacturing method thereof adopts a four-round mask process, thereby reducing the number of manufacturing processes in comparison with the five-round mask process and hence reducing a manufacturing cost accordingly. However, since the four-round mask process still has a complex manufacturing process and a limitation in reducing the manufacturing cost, there is a need for an approach that is capable of further simplifying the manufacturing process and further reducing the manufacturing cost.

SUMMARY OF THE INVENTION

Accordingly, the present invention is directed to an apparatus and method of fabricating a thin film transistor array substrate capable of simplifying a fabricating process, reducing a cost and improving a productivity.

In order to achieve these and other advantages of the invention, an apparatus for fabricating a thin film transistor array substrate comprises a dip strip component for stripping a photo-resist pattern formed on a substrate in a first stripper; a removing component for removing a residual photo-resist pattern; and a first jet strip component for removing residual photo-resist particles on the substrate.

The removing component includes a brushing component.

The brushing component includes a brush capable of rotating at a high speed.

The brushing component includes a brush having hairs that have a length of approximately 1 μm.

The removing component includes a second jet strip component.

The second jet strip component includes a jet nozzle.

The second jet strip component includes a tank for supplying a second stripper to the jet nozzle; a pump for restoring the second stripper, jetted by the jet nozzle, to the tank; and a filter for filtering impurities included in the second stripper.

The jet nozzle is capable of jetting the second stripper at the temperature of at least approximately 70° C.

The jet nozzle is capable of jetting the second stripper under the pressure of at least approximately 1 kg/cm$^2$.

The removing component includes an air jet component.

The air jet component includes an air knife.

The first jet strip component includes a plurality of jet nozzles for jetting a final stripper onto the substrate; a tank for supplying the final stripper to the jet nozzles; a pump for restoring the final stripper, jetted by the jet nozzles, to the tank; and a filter for filtering impurities included in the final stripper.

In order to achieve these and other advantages of the invention, a method of fabricating a thin film transistor array substrate comprises dipping a substrate in a first stripper, wherein the substrate has a photo-resist pattern and a thin film, the thin film being formed on an entire surface of the substrate so as to cover the photo-resist pattern; removing a residual photo-resist pattern and a residual thin film on the substrate; and removing particles left on the substrate by the removing a residual photo-resist pattern and a residual thin film.

The removing the photo-resist pattern and the thin film includes removing the residual photo-resist pattern and the residual thin film by using a rotating brush.

The removing the photo-resist pattern and the thin film includes jetting a second stripper to the substrate by using a jet nozzle.

The jetting a second stripper includes jetting the second stripper at the temperature of at least approximately 70° C.

The jetting a second stripper includes jetting the second stripper under a pressure of at least approximately 1 kg/cm$^2$.

The removing particles includes jetting a final stripper to the substrate through a plurality of jet nozzles to remove the particles of the residual photo-resist pattern and the residual thin film.

The removing the photo-resist pattern and the thin film includes using an air knife to jet air to the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the figures:

FIG. 9 is a drawing showing an apparatus of fabricating a thin film transistor array substrate according to a first embodiment of the present invention;

DETAILED DESCRIPTION OF THE ILLUSTRATED EMBODIMENTS

Reference will now be made in detail to an exemplary embodiments of the present invention, examples of which are illustrated in the accompanying drawing.

Hereinafter, the exemplary embodiments of the present invention will be described in detail with reference to FIGS. 4 to 13.

Figure 1:
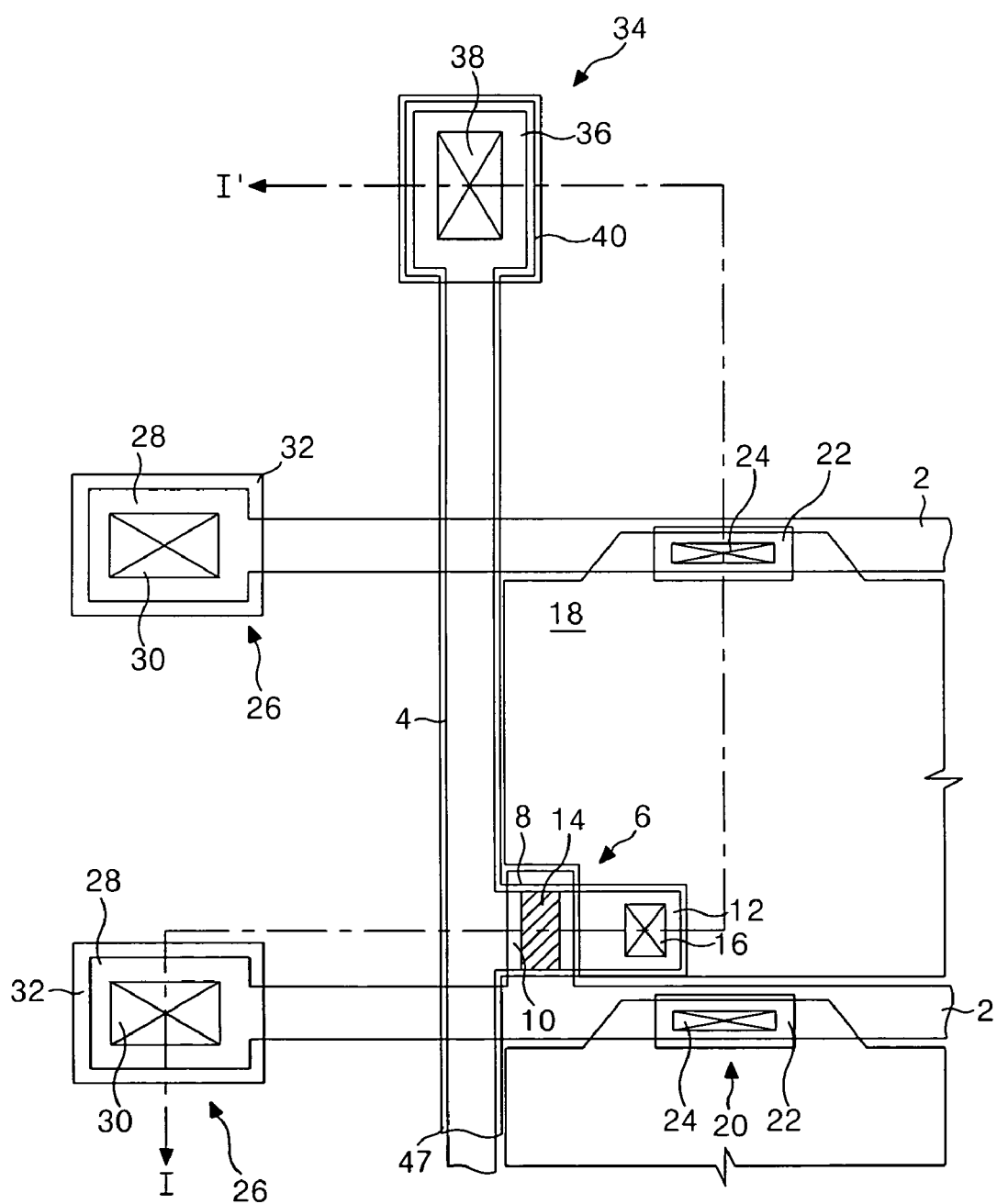
FIG. 1 is a plan view illustrating a portion of a related art thin film transistor array substrate.
Figure 2:
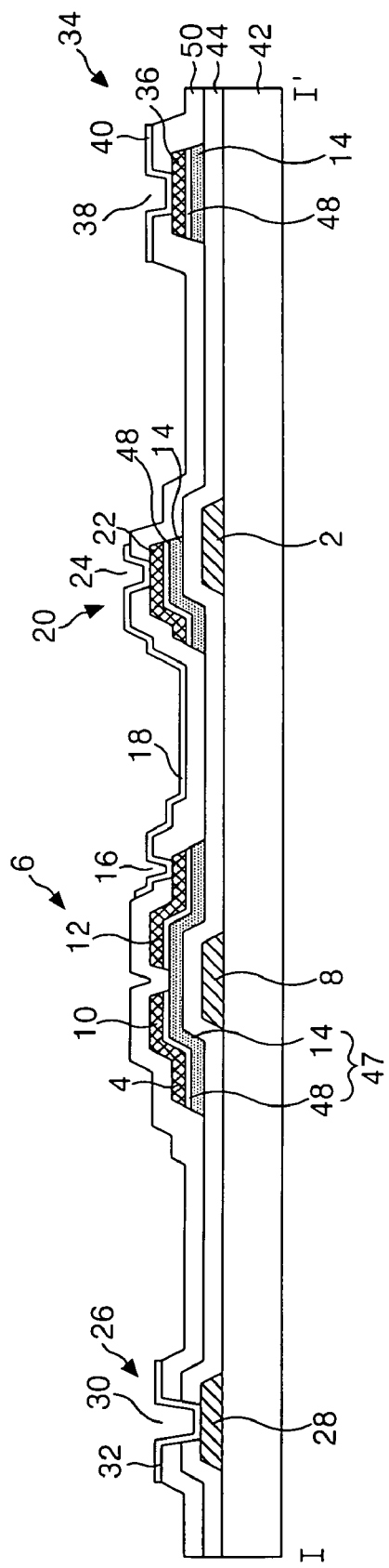
FIG. 2 is a sectional view of the thin film transistor array substrate taken along the line I-I' in FIG. 1.
Figure 3A:
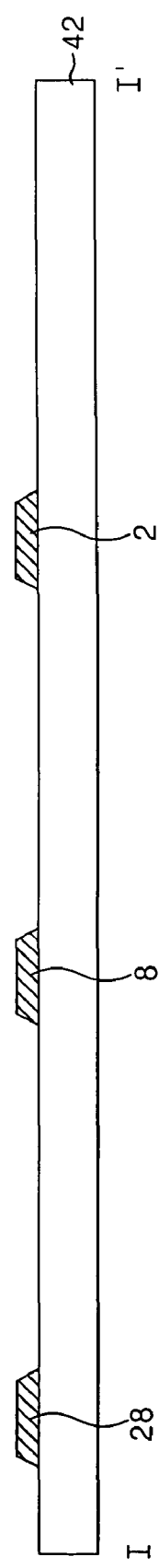
FIGS. 3A to 3D are sectional views sequentially illustrating a method of manufacturing the thin film transistor array substrate shown in FIG. 2.
Figure 3B:
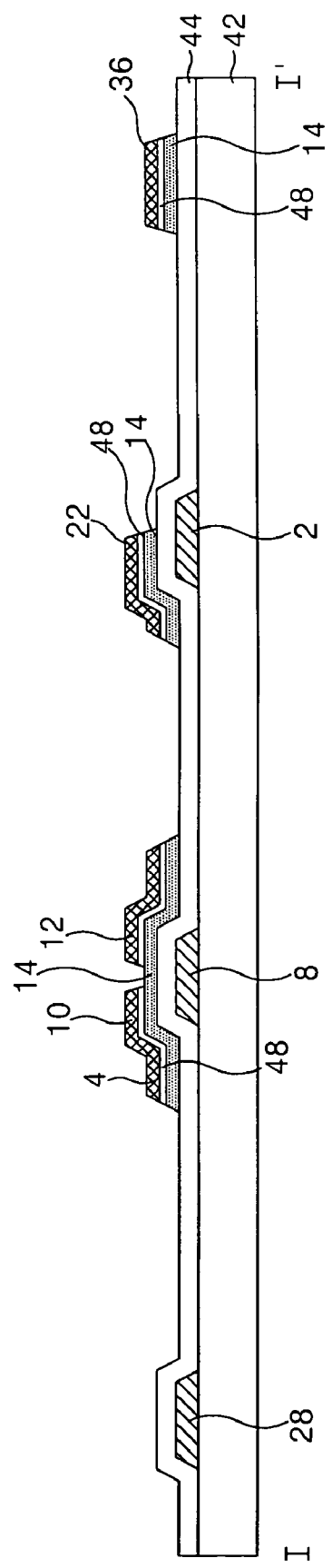
Figure 3C:
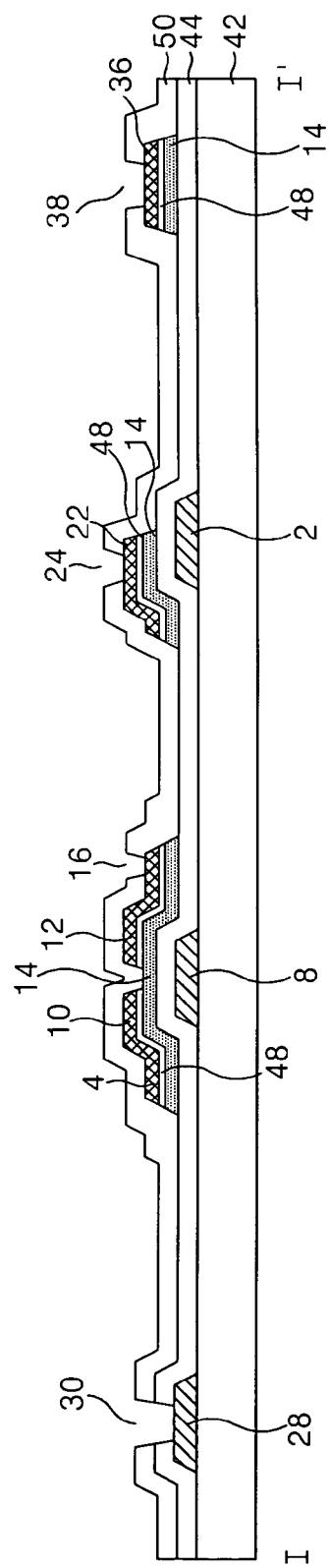
Figure 3D:
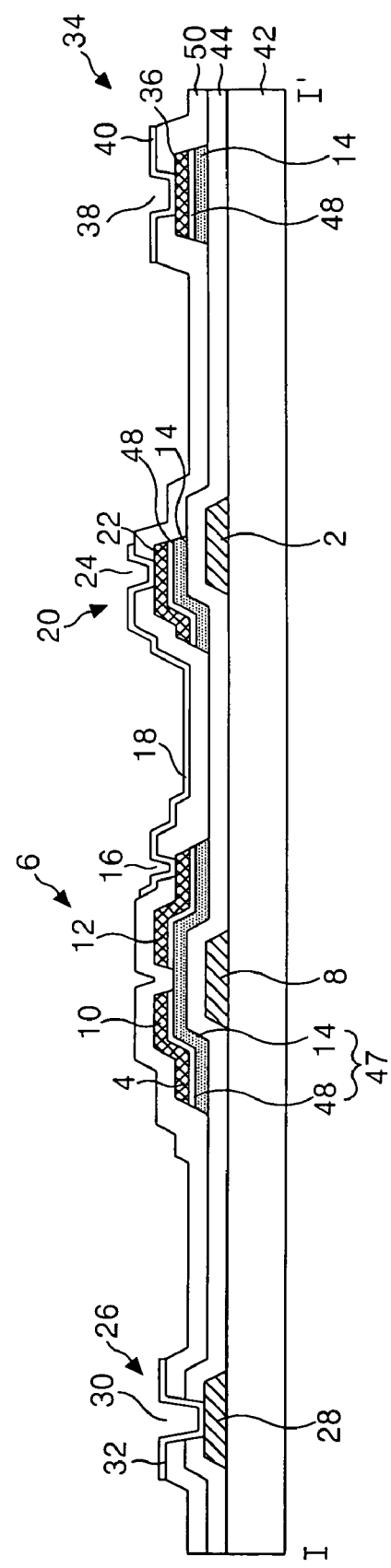
Figure 4:
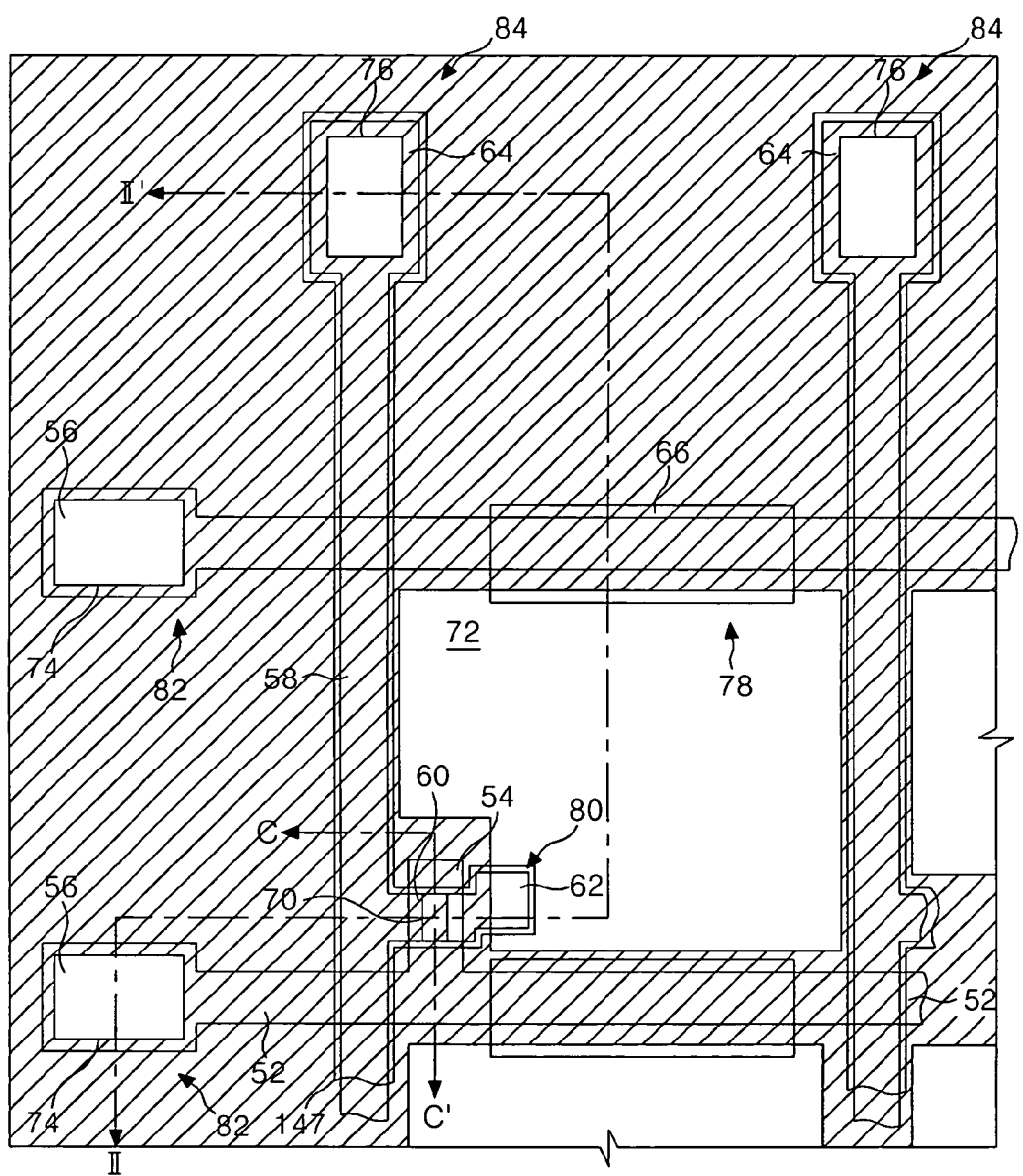
FIG. 4 is a plan view a thin film transistor array substrate fabricated by an apparatus and a method of fabricating a thin film transistor array substrate according to an embodiment of the present invention.
Figure 5:
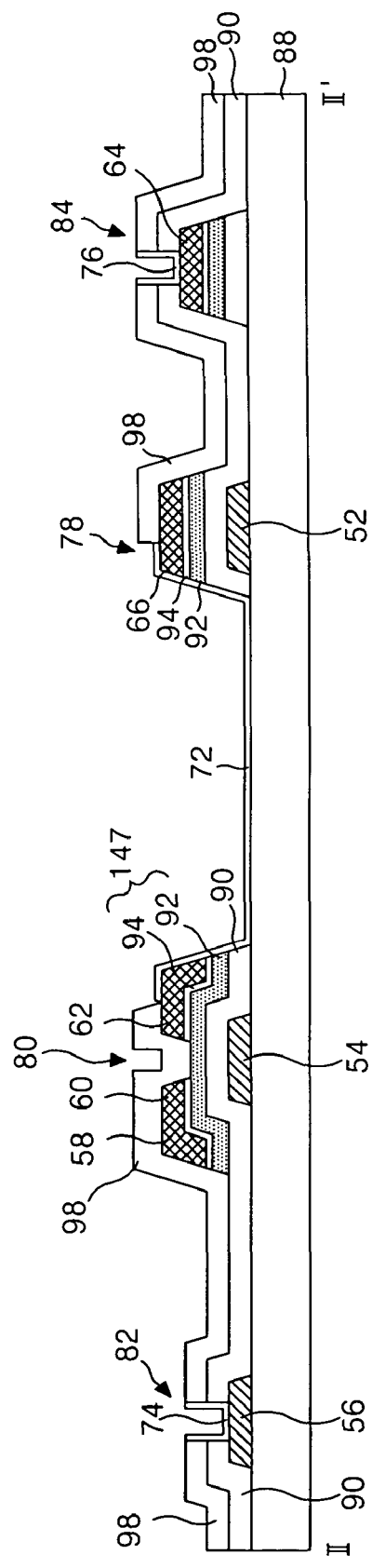
FIG. 5 is a sectional view illustrating the thin film transistor array substrate taken along the line II-II' in FIG. 4.

FIG. 4 is a plan view a thin film transistor array substrate fabricated using an apparatus and a method of fabricating a thin film transistor array substrate according to an embodiment of the present invention. FIG. 5 is a sectional view illustrating the thin film transistor array substrate taken along the line II-II' in FIG. 4.

Referring to FIGS. 4 and 5, the thin film transistor array substrate includes the following: a gate line 52 and a data line 58 crossing each other, with a gate insulating pattern 90 between them, formed on a lower substrate 88; a thin film transistor 80 formed at each crossing; and a pixel electrode 72 in a pixel region defined by the gate and data lines. The thin film transistor array substrate further includes a storage capacitor 78 formed at an overlapped portion between a pre-stage gate line 52 and a storage electrode 66 connected to the pixel electrode 72; a gate pad part 82 connected to the gate line 52; and a data pad part 84 connected to the data line 58.

The thin film transistor 80 includes a gate electrode 54 connected to the gate line 52; a source electrode 60 connected to the data line 58; a drain electrode 62 connected to the pixel electrode 72; and a semiconductor pattern 147 including an active layer 92 overlapping the gate electrode 54 with the gate insulating pattern 90 positioned between them and forming a channel 70 between the source electrode 60 and the drain electrode 62; and an ohmic contact layer 94. The thin film transistor 80, in response to a gate signal supplied to the gate line 52, charges the pixel electrode 72 to establish and maintain a pixel voltage according to the signal supplied through the data line 58.

The semiconductor pattern 147 includes the active layer 92 having the channel portion between the source electrode 60 and the drain electrode 62. The active layer 92 overlaps with the source electrode 60, the drain electrode 62, the data line 58 and a lower data pad electrode 64. Also, the active layer 92 overlaps with the storage electrode 66 and partially overlaps the gate line 52 with the gate insulating pattern 90 positioned therebetween. The semiconductor pattern 147 further includes an ohmic contact layer 94 formed on the active layer 92 for making ohmic contact with the source electrode 60, the drain electrode 62, the storage electrode 66, the data line 58 and the lower data pad electrode 64.

The pixel electrode 72 is connected to the portion of the drain electrode 62 of the thin film transistor 80 where the drain electrode 62 is exposed to the exterior by a passivation film pattern 98. The pixel electrode 72 applies an electric potential between a common electrode formed on an upper substrate (not shown) according to a charged pixel voltage. By this electric potential, the liquid crystal material located between the thin film transistor substrate and a color filter array substrate rotates due to the liquid crystal's dielectric anisotropy and causes incident light from a light source (not shown) to be transmitted through the substrate 88 and the pixel electrode 72.

The storage capacitor 78 includes a pre-stage gate line 52 and the storage electrode 66. The storage electrode 66 overlaps with the pre-stage gate line 52, the gate insulating pattern 90, the active layer 92 and the ohmic contact layer 94 between them. Herein, the pixel electrode 72 is connected to the storage electrode 66 exposed to the exterior by the passivation film pattern 98. The storage capacitor 78 substantially maintains the pixel voltage applied to the pixel electrode 72 until a next pixel voltage is applied.

The gate line 52 is connected to a gate driver (not shown) through the gate pad part 82. The gate pad part 82 includes a lower gate pad electrode 56 extending from the gate line 52 and an upper gate pad electrode 74 connected on the lower gate pad electrode 56.

The data line 58 is connected to a data driver (not shown) through a data pad part 84. The data pad part 84 includes a lower data pad electrode 64 extending from the data line 58 and an upper data pad electrode 76 connected on the lower data pad electrode 64. Further, the data pad part 84 includes the gate insulating pattern 90, the active layer 92, and the ohmic contact layer 94 formed between the lower data pad electrode 64 and the lower substrate 88.

The passivation film pattern 98 is formed in the region where the pixel electrode 72, the upper gate pad electrode 74 and the upper data pad electrode 76 are not formed.

The thin film transistor array substrate having such an arrangement is manufactured through the use of a three-round mask process according to the present invention. An exemplary method of manufacturing the thin film transistor array substrate according to the present invention includes a first mask process for forming the gate patterns, a second mask process for forming the semiconductor pattern and the source/drain pattern, and a third mask process for forming the gate insulating pattern 90, the passivation film pattern 98 and the transparent electrode pattern.

FIGS. 6A to 8D are plan views and sectional views sequentially illustrating an exemplary method of fabricating the thin film transistor array substrate according to the present invention.

Figure 6A:
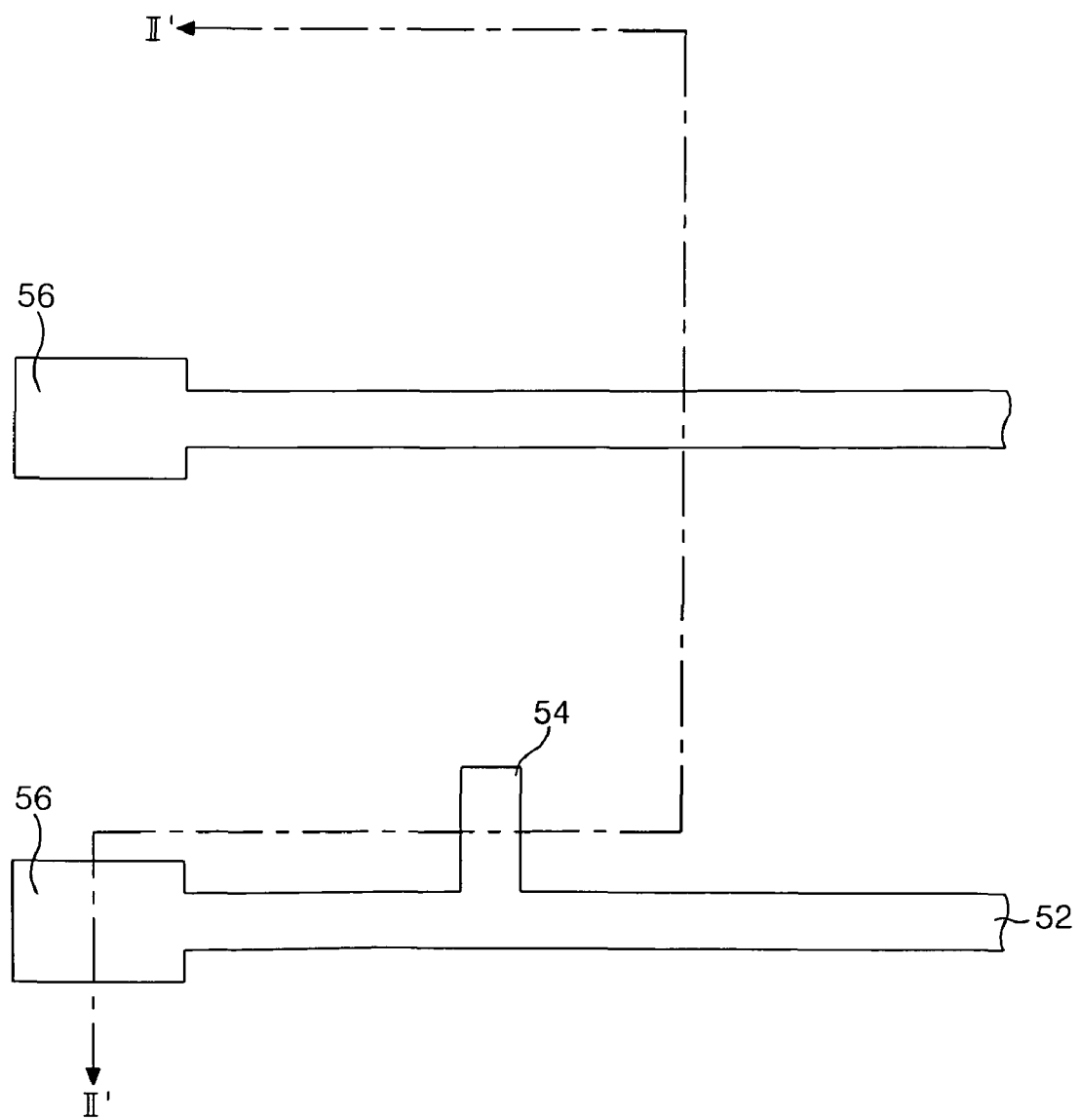
FIGS. 6A to 6B are plan views sequentially illustrating a method of fabricating the thin film transistor array substrate according to an embodiment of the present invention.
Figure 6B:
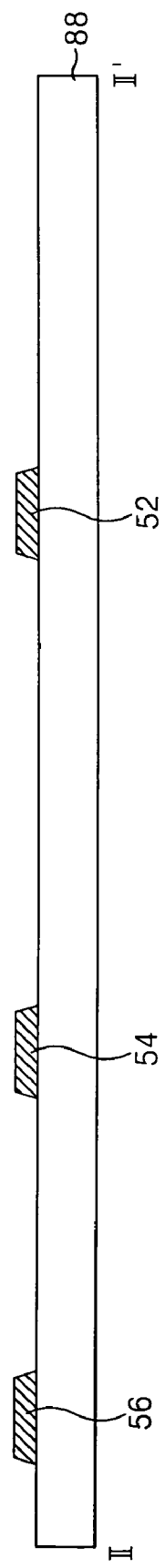

FIGS. 6A and 6B are respectively a plan view and a sectional view illustrating gate patterns formed on a lower substrate 88 by the first mask process of the exemplary fabrication method. Referring to FIGS. 6A and 6B, a gate metal layer is formed by a deposition method such as a sputtering method on the lower substrate 88. Subsequently, the gate metal layer may be patterned through a photolithography process using the first mask and an etching process, thereby forming the gate patterns including the gate line 52, the gate electrode 54, and the lower gate pad electrode 56. The gate metal may include Cr, MoW, Cr/Al, Cu, Al(Nd), Mo/Al, Mo/Al(Nd), Cr/Al(Nd) or the like, and may be formed in a single layer or a double layer structure.

Figure 7A:
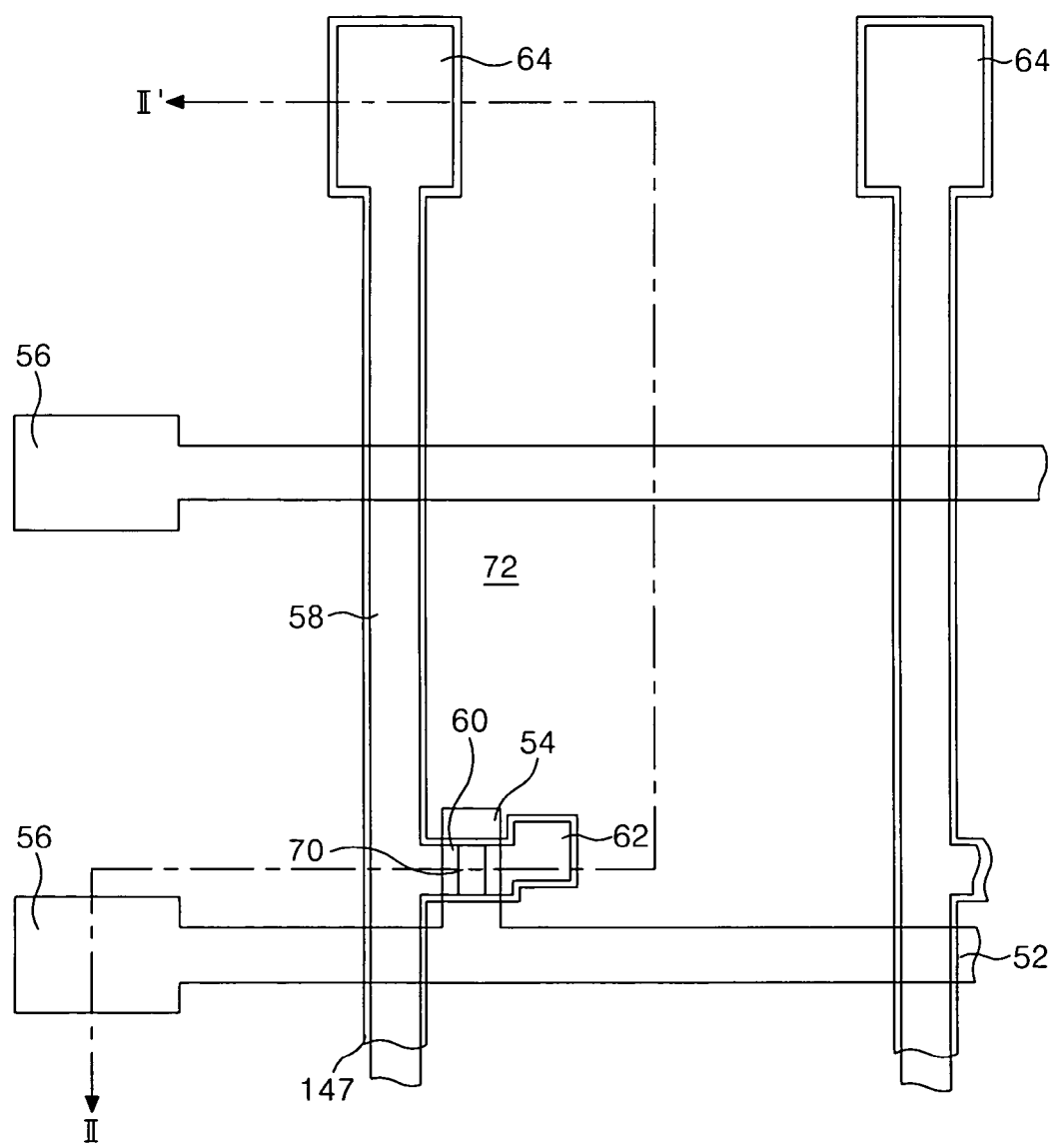
FIGS. 7A to 7C are plan views and sectional views sequentially illustrating a method of fabricating the thin film transistor array substrate according to an embodiment of the present invention.
Figure 7B:
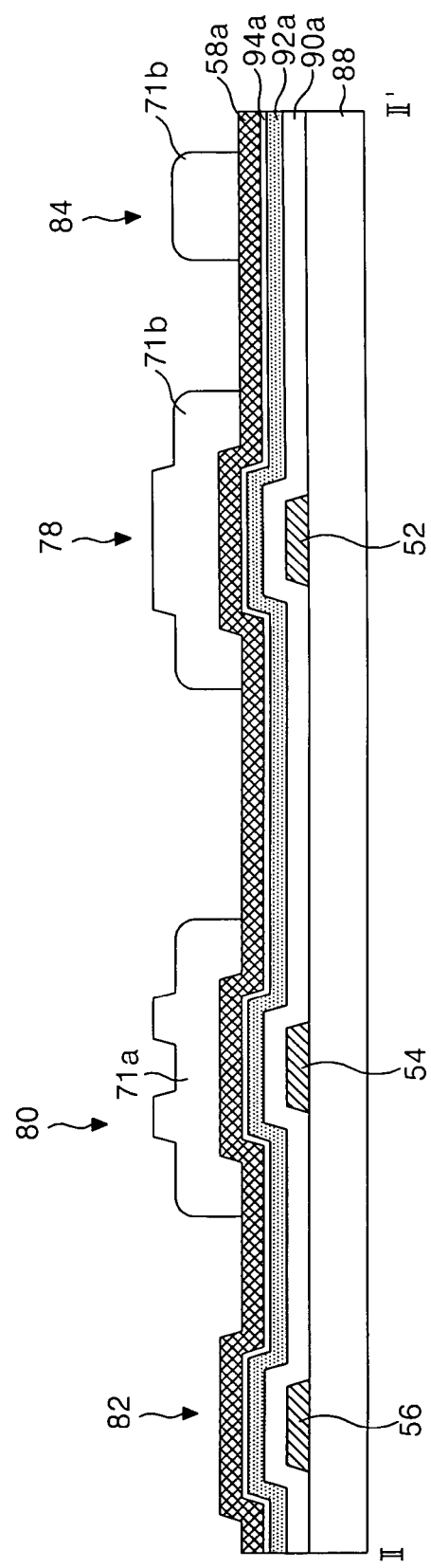
Figure 7C:
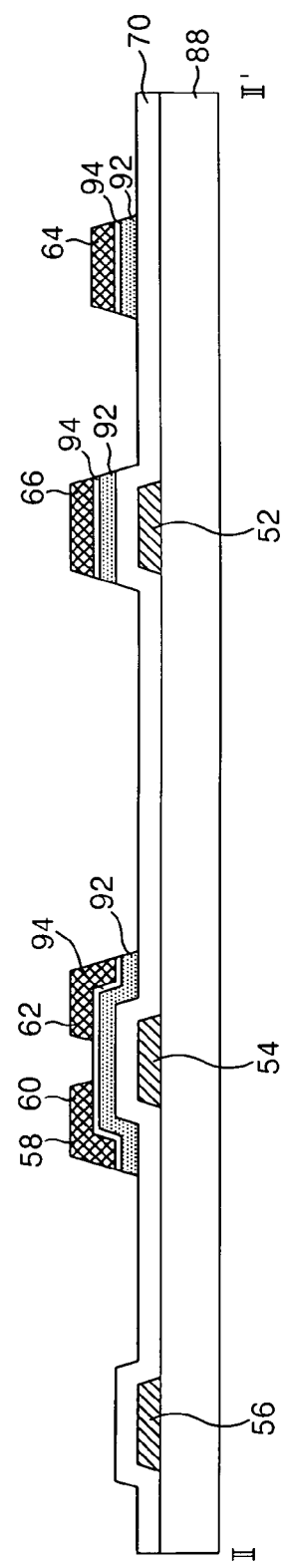

FIG. 7A is a plan view, and FIGS. 7B-7C are sectional views illustrating a substrate including a source/drain pattern and a semiconductor pattern formed by the second mask process according to the exemplary fabrication process of the present invention.

Referring to FIGS. 7A to 7C, a gate insulating layer 90a, an amorphous silicon layer, a n$^+$ amorphous silicon layer, and a source/drain metal layer are sequentially formed on the lower substrate 88 and gate patterns by a deposition technique such as a plasma enhanced chemical vapor deposition (PECVD) and a sputtering method. Herein, the gate insulating layer 90a may be made of an inorganic insulating material such as silicon oxide ($SiO_x$) or silicon nitride ($SiN_x$). The source/drain metal layer may be made of molybdenum (Mo), titanium (Ti), tantalum or molybdenum alloy or the like.

Next, a photo-resist pattern 71b is formed through a photolithography process using the second mask and an etching process, as illustrated in FIG. 7B. A diffractive exposure mask having a diffractive exposing part may be used as a second mask wherein the diffractive exposing part corresponds to a channel portion of the thin film transistor. The resulting photo-resist pattern at the channel portion 71a has a lower height than the photo-resist pattern of the source/drain pattern part 71b.

Subsequently, the source/drain metal layer is patterned by a wet etching process using the photo-resist pattern 71b to provide source/drain patterns including the data line 58, the source electrode 60, the drain electrode 62 being integral to the source electrode 60, and the storage electrode 66.

Next, the amorphous silicon layer and the n$^+$ amorphous silicon layer are patterned substantially at the same time by a dry etching process using the same photo-resist pattern 71b to thereby provide the ohmic contact layer 94 and the active layer 92.

Also, the portion of the photo-resist pattern 71a having a relatively low height, i.e. over the channel portion, is removed by an ashing process, and thereafter the source/drain pattern and the ohmic contact layer 94 of the channel portion are etched by a dry etching process. Accordingly, the active layer 92 of the channel portion is exposed to separate the source electrode 60 from the drain electrode 62. Thereafter, a remainder of the photo-resist pattern left on the source/drain pattern part is removed using a stripping process.

Figure 8A:
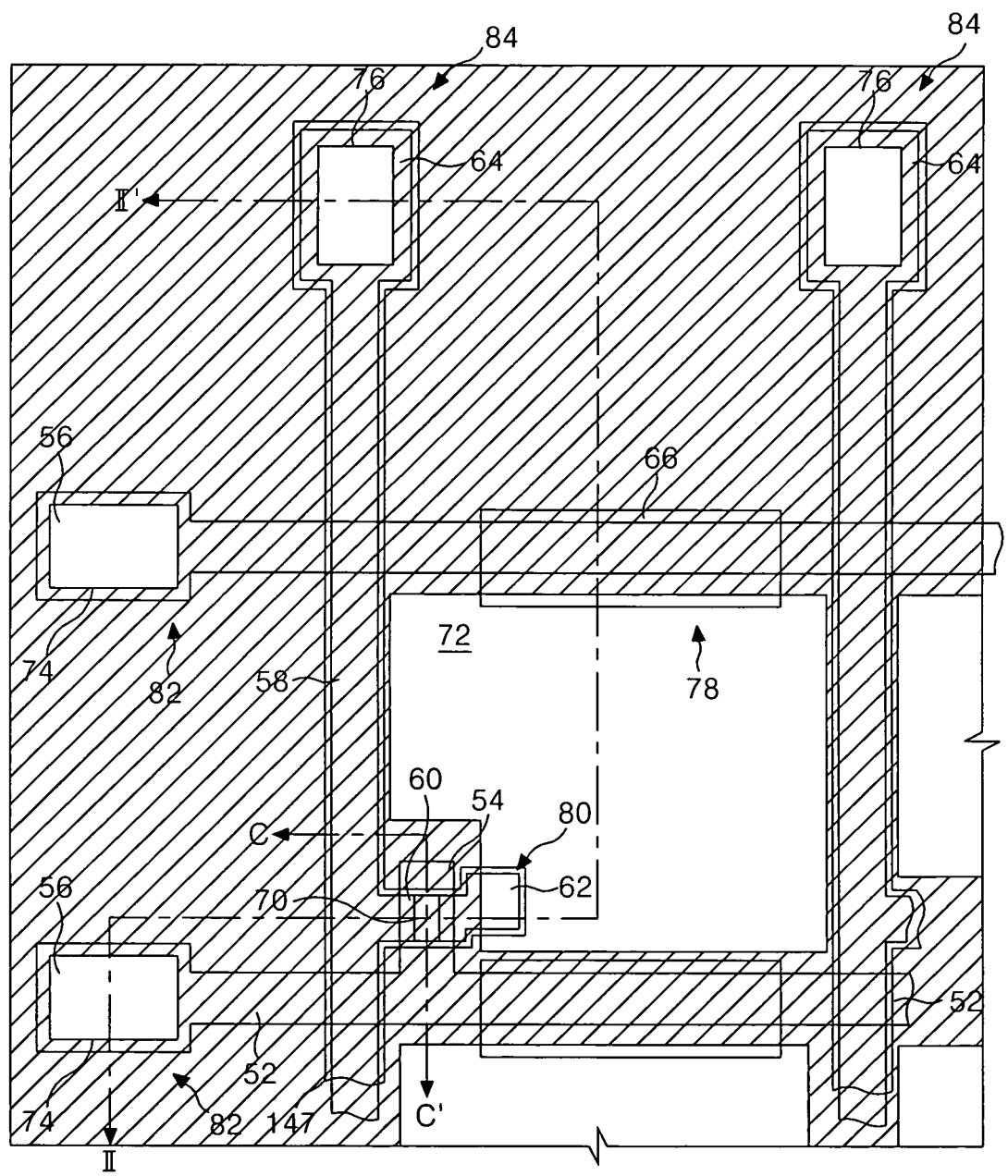
FIGS. 8A to 8D are plan views and sectional views sequentially illustrating a method of fabricating the thin film transistor array substrate according to an embodiment of the present invention.
Figure 8B:
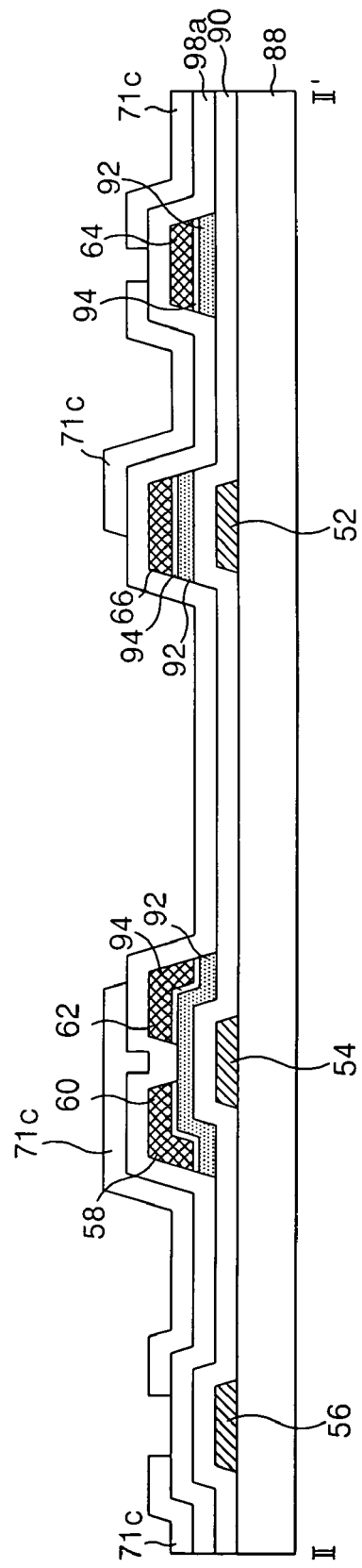
Figure 8C:
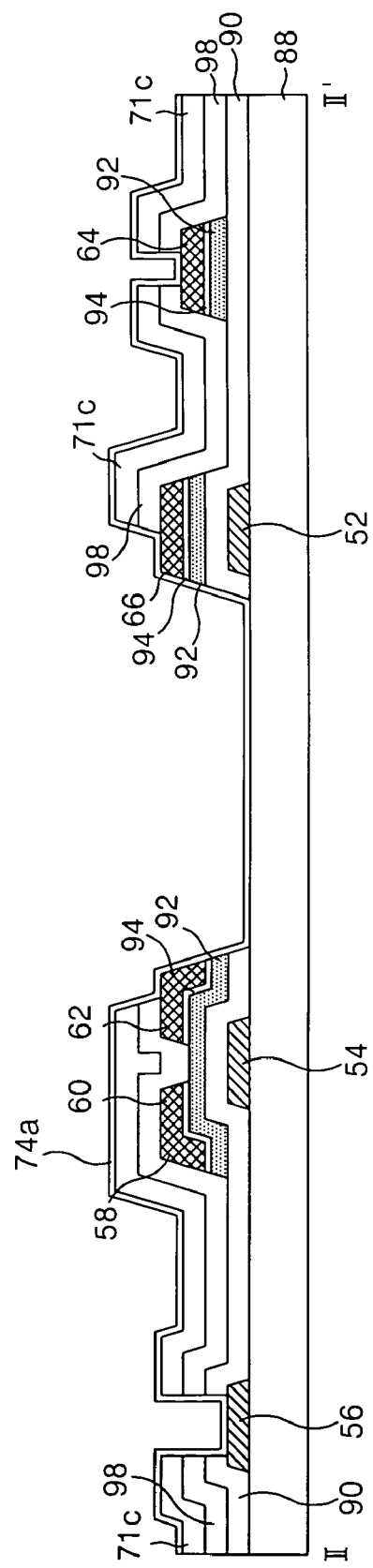
Figure 8D:
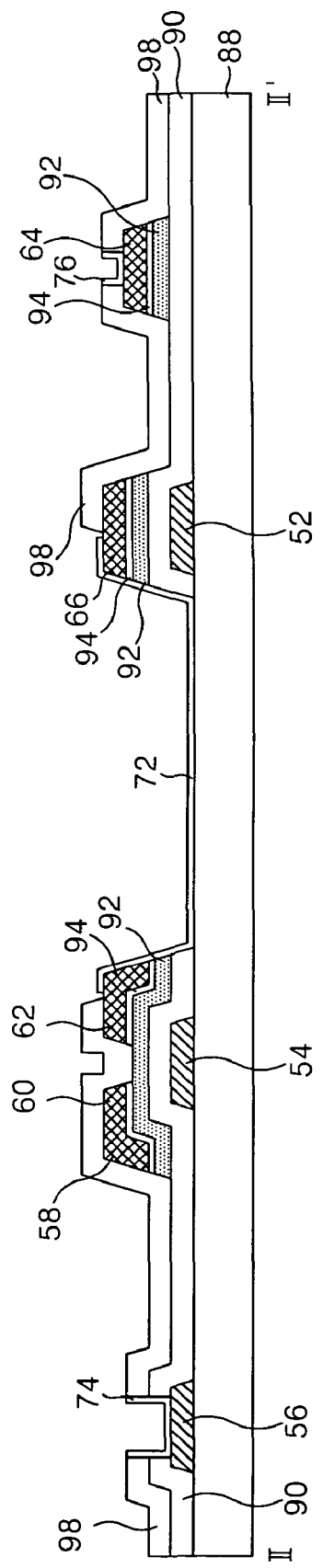

FIG. 8A is a plan view, and FIGS. 8C-8D are a sectional views illustrating a substrate including the gate insulating pattern 90, the passivation film pattern 98 and the transparent electrode pattern formed by the third mask process of the exemplary process according to the present invention.

Referring to FIGS. 8A to 8D, a passivation film 98a is deposited by a deposition technique such as a sputtering on the gate insulating film 90a having the source/drain patterns. The passivation film 98a may be made of an inorganic insulating material such as silicon oxide ($SiO_x$) and silicon nitride ($SiN_x$), or an organic insulating material having a small dielectric constant such as an acrylic organic compound, an organic insulating material such as BCB (benzocyclobutene) or PFCB (perfluorocyclobutane).

A photo-resist is applied substantially entirely to the passivation film 98a. Subsequently, a photo-resist pattern 71c is formed through a photolithography process using the third mask, as illustrated in FIG. 8B. Afterward, the passivation film 98a and the gate insulating film 90a are patterned by a dry-etching process using the photo-resist pattern 71c as a mask, thereby forming a passivation film pattern 98 and the gate insulating pattern 90 as illustrated in FIG. 8C. The passivation film pattern 98 is substantially disposed on areas of the substrate that will not have a transparent electrode. In other words, the transparent electrode and the passivation film/gate insulation layers will occupy substantially exclusive areas.

Next, a transparent electrode material 74a is entirely deposited on the substrate 88 having the photo-resist pattern 71c by a deposition technique such as a sputtering method, as illustrated in FIG. 8C. The transparent electrode material 74a may be made of an indium-tin-oxide (ITO), a tin-oxide (TO), an indium-zinc-oxide (IZO), or another transparent conductive material. The photo-resist pattern 71c is removed from the thin film transistor array substrate having the transparent electrode material deposited thereon by a stripping process using a lift-off method. The transparent electrode material 74a deposited on the photo-resist pattern 71c is removed along with the photo-resist pattern 71c to form a transparent pattern including the upper gate pad electrode 74, the pixel electrode 76 and the upper data pad electrode 85, as illustrated in FIG. 8D.

The upper gate pad electrode 74 is formed to cover the lower gate pad electrode 56. The pixel electrode 72 is connected to the drain electrode 62 of the thin film transistor and the storage electrode 66 of the storage capacitor 78, and the upper data pad electrode 85 is electrically connected to the lower data pad electrode 64.

As described above, the transparent electrode pattern can be formed by the lift-off method used in the third mask process of the exemplary process of the present invention, without using a separate mask process.

In other words, after the transparent electrode material is deposited on the photo-resist pattern remained on the passivation film pattern, the remained photo-resist pattern and the transparent electrode material overlapping the remained photo-resist pattern are removed by a stripping process using a lift-off method, to thereby form the transparent electrode pattern. Accordingly, the exemplary method of fabricating the thin film transistor array substrate according to the present invention may simplify the fabrication processes compared with related art methods using four or five-round mask processes. Thus, processing may be made more efficient, and fabrication costs reduced.

Figure 12:
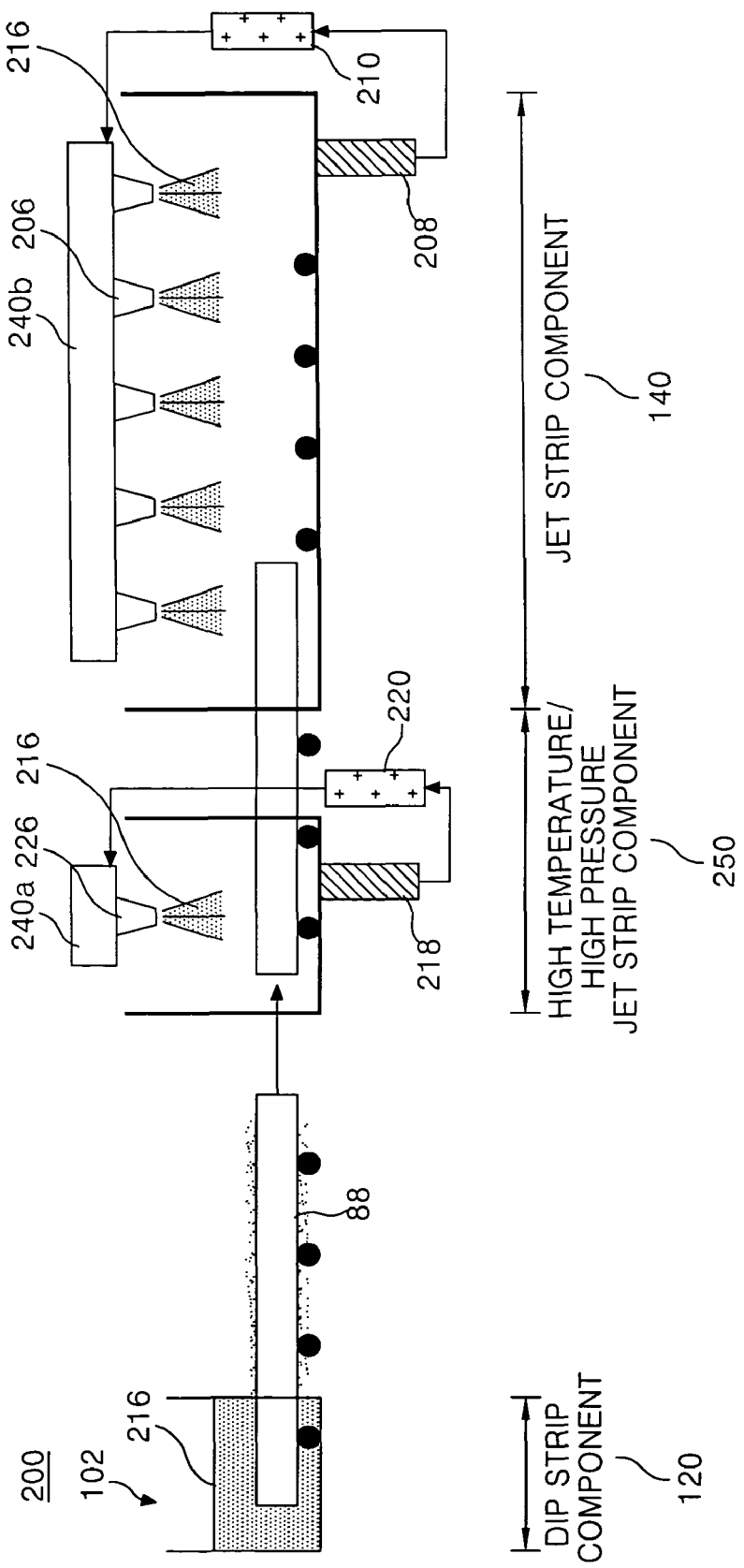
FIG. 12 is a drawing showing an apparatus of fabricating a thin film transistor array substrate according to a second embodiment of the present invention.
Figure 13:
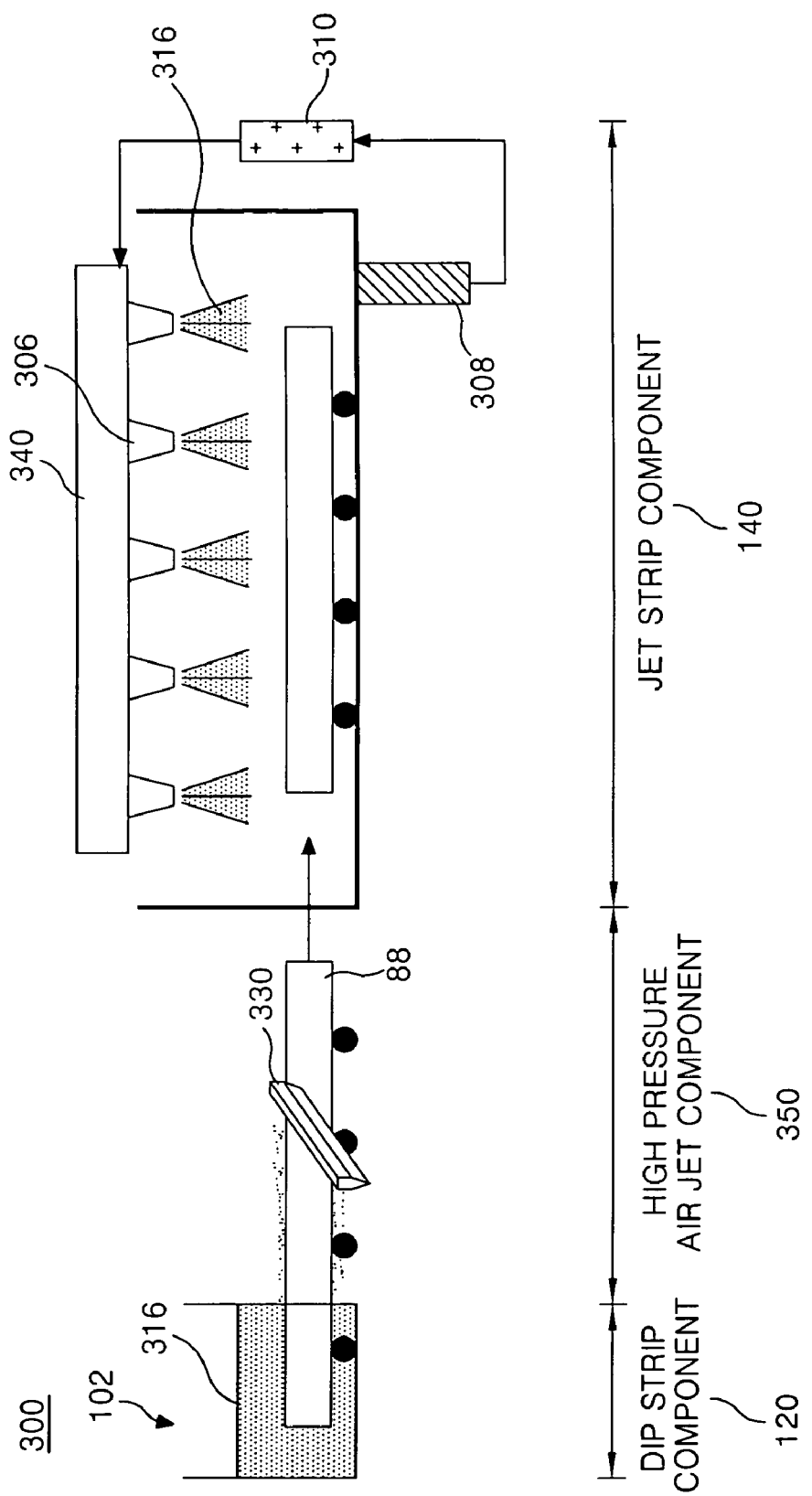
FIG. 13 is a drawing showing an apparatus of fabricating a thin film transistor array substrate according to a third embodiment of the present invention.

As an alternative to the stripping process, the photo-resist pattern and the transparent electrode material overlapping the photo-resist pattern may preferably be removed using the fabricating apparatus illustrated in FIGS. 9, 12 and 13.

Figure 10:
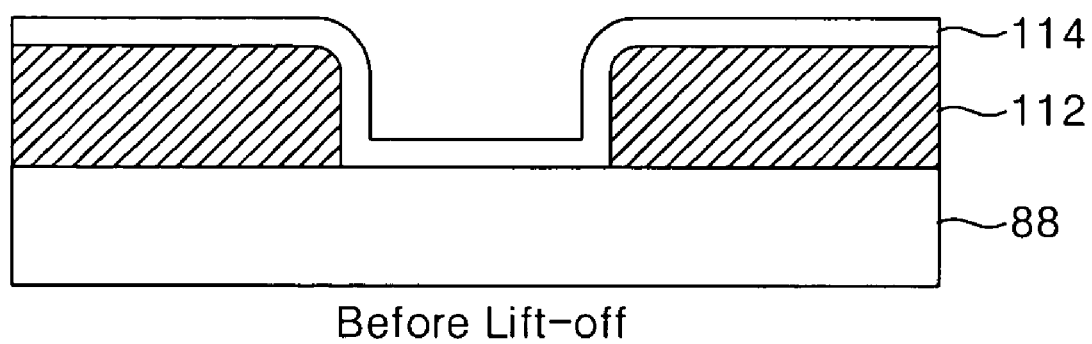
FIG. 10 is a sectional view illustrating the thin film transistor array substrate before a lift-off process.

FIG. 9 illustrates a first exemplary apparatus for fabricating a thin film transistor array substrate according to the present invention. Referring to FIG. 9, the first exemplary apparatus 100 for fabricating a thin film transistor array substrate according to the present invention includes: a dip strip component 120 in which a lower substrate 88 with a photo-resist pattern 112 and a deposition film 114 illustrated in FIG. 10 is dipped to be stripped; a brushing component 130 for removing the patterned photo-resist 112 and the deposition film 114 remaining on the lower substrate 88 finished by the dip strip process; and a jet strip component 140 for removing remaining particles of photo-resist remaining on the lower substrate 88 finished by the brushing process.

The dip strip component 120 includes a container 102 in which a stripper is contained. An exemplary method for operating the dip strip component 120, hereinafter referred to as the dip strip process, is as follows. The lower substrate 88 with the photo-resist pattern 112 and the deposition film 14 is dipped in the container 102 for approximately an hour. When the lower substrate 88 with the photo-resist pattern 112 and the deposition film 14 formed thereon is dipped in the container 102, most of the photo-resist pattern 112 and the deposition film 114 except for a pattern part being formed on the lower substrate 88 are removed.

The brushing component 130 includes a brush 104 whose surface has a plurality of fine hairs with a length of about 1 μm. An exemplary method for using the brushing component 130, hereinafter referred to as the brushing process, is as follows. The brush 104 removes remaining portions of the photo-resist pattern 112 and the deposition film 114 from the patterned lower substrate 88 that were not removed in the dip strip process. Other patterned layers on the patterned substrate 88, for example, the patterned passivation film 98, remains on the substrate. As described here, the patterned lower substrate 88 includes the layers making up the thin film transistor array that are disposed on the lower substrate. In this exemplary method, the brush 104 rotates at a high speed. The surface of the brush 104 has the fine hairs with the length of about 1 μm, and the photo-resist pattern 112 and the deposition film 114 on the patterned lower substrate 88 are removed by the fine hairs. If the brushing process is used, then time required to dip the patterned lower substrate 88 in the dip strip process can be reduced.

The pattern to be formed on the lower substrate 88 is finished by the brushing process. The photo-resist pattern 112 and the deposition film 114 formed on the patterned lower substrate 88 are removed by imposing a physical force caused by rotating the brush 104. As a result, particles of photo-resist pattern may be generated.

The jet strip component 140 includes: a plurality of jet nozzles 106 for jetting a stripper 116 to remove the particles of photo-resist remaining on the patterned lower substrate 88 after the brushing process; a tank 140 for supplying the stripper 116 to be jetted by the jet nozzles 106; a pump 108 for restoring the stripper 116 jetted by the jet nozzles 106 to the tank 140; and a filter for filtering the stripper 116 restored by the pump 108 to the tank 140.

Figure 11:
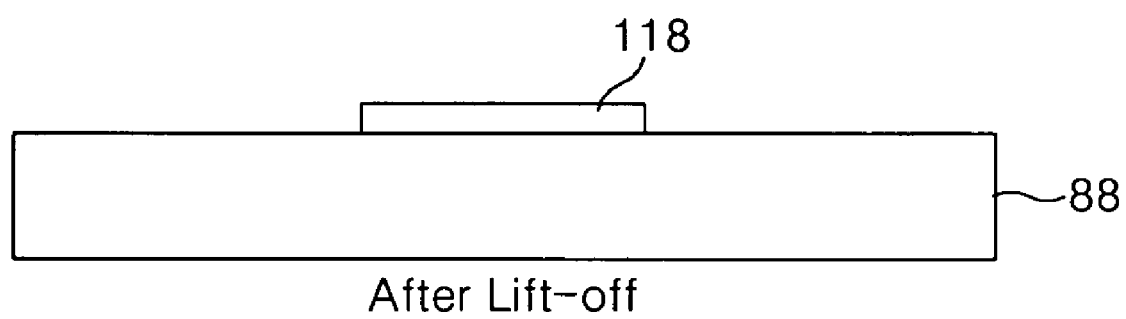
FIG. 11 is a sectional view illustrating the thin film transistor array substrate after the lift-off process through the apparatus of fabricating the thin film transistor array substrate shown in FIG. 10.

In an exemplary method for operating the jet strip component 140, jet nozzles 106 receive the stripper 116 from the tank 140 in which the stripper 116 is stored and then jets the stripper onto the patterned lower substrate 88. When the stripper 116 is jetted to the patterned lower substrate 88, the particles of photo-resist pattern, which may generated by the brushing process, are removed from the lower substrate 88. As a result, a desired pattern 118 can be formed on the lower substrate as shown in FIG. 11.

The pump 108 restores the stripper 116 jetted by the jet nozzles 106 to the tank 140, thereby reducing the amount of the stripper 116 used and minimizing waste.

The filter 110 filters the stripper 116 restored to the tank 140 by the pump 108 to remove impurities in the stripper 116, and then restores the filtered stripper 106 to the tank 140. This is to prevent contamination of the fabricating apparatus 100. For example, filtration prevents contamination of a pipe through which the stripper flows, and thus avoids damage to the pattern on the substrate. Thus, strip process efficiency is maintained, and contamination of the fabricating apparatus 100 is prevented.

According to an exemplary method of fabricating the thin film transistor array substrate in the first exemplary embodiment of the apparatus 100, most of the photo-resist pattern 112 and the deposition film 114 formed on the patterned lower substrate 88 are removed through the dip strip process, and then the remaining photo-resist pattern 112 and the deposition film 114 of the patterned lower substrate are removed by imposing the physical force to the lower substrate 88 through the brushing process. After that, remaining particles of the photo-resist pattern on the patterned lower substrate 88 are removed through the jet strip process, thereby forming a pattern 118.

The stripper used in the jet strip process 140 may be different from the stripper used in the dip strip process 120.

According to the first exemplary fabricating apparatus 100 of the present invention, the time required to remove the photo-resist pattern remaining from the passivation film pattern by a stripping process using a lift-off method is reduced. Advantages include improved productivity of thin film transistor array substrate fabrication, and a reduced amount of stripper 116 used, which leads a reduction in fabrication costs. Further, particles of photo-resist generated during the fabricating process are removed to prevent contamination of the fabricating apparatus. Accordingly, it is possible to reduce defects in the thin film transistor array substrate.

FIG. 12 illustrates a second exemplary apparatus for fabricating a thin film transistor array substrate according to the present invention. The second exemplary fabricating apparatus has certain elements that are substantially similar to those of the fabricating apparatus 100 according to the first exemplary embodiment. Among the exceptions are that the brush component 130 is substantially replaced by a high temperature/high pressure jet strip component 250.

Referring to FIG. 12, the fabricating apparatus 200 of the thin film transistor array substrate according to the second embodiment of the present invention includes: a dip strip component 120 in which a patterned lower substrate 88 with a photo-resist pattern 112 and a deposition film 114 is dipped to be stripped; a high temperature/high pressure jet strip component 250 for removing the photo-resist pattern 112 and the deposition film 114 remaining on the patterned lower substrate after the dip strip process; and a jet strip component 140 for removing particles of the photo-resist pattern remaining on the patterned lower substrate 88 after the high temperature/high pressure jet strip process.

The high temperature/high pressure jet strip component 250 includes: a high temperature/high pressure jet nozzle 226 for jetting the stripper 216 under a high temperature and high pressure; a first tank 240a for supplying the stripper 216 to the high temperature/high pressure jet nozzle 226; a first pump 218 for restoring the stripper 216 jetted by the high temperature/high pressure jet nozzle 226 to the first tank 240a; and a first filter 220 for filtering the stripper 216 restored by the first pump 218 to the first tank 240a.

The first pump 218 and the first filter 220 may be substantially similar to the pump 108 and the filter 110 of the first exemplary apparatus, respectively. Further, the first pump 218 and the first filter 220 may perform substantially similar functions to the pump 108 and the filter 110 of the first exemplary apparatus, respectively.

The stripper used in the dip strip component 120 may be different from the stripper used in the high temperature/high pressure jet strip component 250, which may further be different from the stripper used in jet strip component 140.

In an exemplary method of using the second exemplary apparatus, hereinafter referred to as the temperature/high pressure jet strip process, the high temperature/high pressure nozzle 226 jets the stripper 216, at a temperature of approximately 70° C. or more and under a pressure of approximately 1 kg/cm$^2$ or more. The nozzle 226 may jet the stripper 216 selectively at the photo-resist pattern 112 and the deposition film 114 of the patterned lower substrate 88, or may jet the stripper substantially uniformly over the patterned lower substrate 88. The high temperature/high pressure nozzle 226 substantially removes the photo-resist pattern 112 and the deposition film 114 remaining after the dip strip process.

The exemplary temperature/high pressure jet strip process may significantly reduce the time required to remove the photo-resist pattern 112 and the deposition film 114 from the patterned lower substrate 88. The process may also more effectively remove the photo-resist pattern 112 and the deposition film 114 compared to related art practice.

The high temperature/high pressure jet strip process substantially finishes the fabrication process of the patterned lower substrate 88 by removing the remaining photo-resist pattern 112 and the deposition film 114 from the patterned substrate left from the dip strip process. However, since the photo-resist pattern 112 and the deposition film 114 formed on the lower substrate 88 are removed through the physical force of the stripper jetted under the high pressure of about 1 kg/cm$^2$ or more, particles of photo-resist may be produced. The particles of photo-resist is removed through the jet strip process using the jet strip component 140, which includes a plurality of jet nozzles 206 for jetting the stripper 216, a second tank 240b for supplying the stripper 216 jetted by the jet nozzles 206; a second pump 208 for restoring the stripper 216 jetted by the jet nozzles 206 to the first tank 240b; and a second filter 210 for filtering the stripper 216 restored by the second pump 208 to the first tank 240b.

According to an exemplary method of fabricating the thin film transistor array substrate using the second exemplary apparatus of the present invention, most of the photo-resist pattern 112 and the deposition film 114 formed on the lower substrate 88 are removed through the dip strip process, and then the remaining photo-resist pattern 112 and the deposition film 114 are removed from the patterned lower substrate 88 by chemical and physical effects through the high temperature/high pressure jet strip process. Thereafter, any particles of photo-resist remaining on the lower substrate 88 are removed through the jet strip process, thereby forming a pattern 118.

According to the fabricating apparatus 200 of the thin film transistor array substrate in the second embodiment of the present invention, the time required to remove the photo-resist pattern remaining on the passivation film pattern by a stripping process using a lift-off method is reduced, thereby improving the productivity of the thin film transistor array substrate fabrication and, in addition, reducing the amount of the stripper 116 used to save fabricating costs. Further, particles of the photo-resist pattern generated upon the fabricating process are removed to prevent a contamination of the fabricating apparatus, thereby reducing defects in the resulting thin film transistor array substrates.

FIG. 13 illustrates a third exemplary apparatus for fabricating a thin film transistor array substrate according to the present invention. The third exemplary apparatus may have elements substantially similar to those of the fabricating apparatus 100 according to the first exemplary apparatus of the present invention except that the brushing component 130 is substantially replaced by an apparatus for jetting air at a high pressure.

Referring to FIG. 13, a third exemplary fabricating apparatus 300 includes: a dip strip component 120 in which a patterned lower substrate 88 provided with a photo-resist pattern 112 and a deposition film 114 is dipped to be stripped; a high-pressure air jet component 350 for removing the photo-resist pattern 112 and the deposition film 114 remaining on the patterned lower substrate 88 after the dip strip process; and a jet strip component 140 for removing the particle of the photo-resist pattern remaining on the lower substrate 88.

An exemplary high-pressure air jet component 350 includes an air knife 330 for jetting air under the high pressure. The air knife 330 may jet high-pressure air onto the photo-resist pattern 112 and a deposition film 114 on the lower substrate 88, or may jet high pressure air onto the entire patterned lower substrate 88. The air knife 330 substantially removes remaining photo resist left on the patterned lower substrate 88 after the dip strip process.

Although the photo-resist pattern 112 and a deposition film 114 are substantially removed from the patterned lower substrate 88 at the completion of the high pressure air jet process, particles of the photo-resist can be produced on the lower substrate by the air jetted by the air knife 330 under the high pressure. The photo-resist particles are subsequently removed by the jet strip process using the jet strip component 140. The jet strip component 140 includes a plurality of jet nozzles 306 for jetting a stripper 316; a tank 340 for supplying the stripper 316 to be jetted by the jet nozzles 306; a pump 308 for restoring the stripper 316 jetted by the jet nozzles 306 to the tank 340; and a filter 310 for filtering the stripper 306 restored by the pump 308 to the tank 340.

In an exemplary method of using the third exemplary fabricating apparatus, most of the photo-resist pattern 112 and the deposition film 114 formed on the patterned lower substrate 88 are removed through the dip strip process, and then the remaining photo-resist pattern 112 and deposition film 114 are removed by the high-pressure air jet process. After that, the jet strip process removes the remaining particles of photo-resist from the lower substrate 88, thereby forming pattern 118.

The stripper used in the dip strip component 120 may be different from the stripper used in the jet strip component 140.

As described above, the exemplary apparatuses and the methods of using them according to the present invention reduce the time required to remove the photo-resist pattern remained on the passivation film pattern by a stripping process using a lift-off method. Reducing the time required is consistent with improvement in productivity and reduction of fabrication costs. Also, the exemplary embodiments of the present invention, may reduce the amount of the stripper used in the stripping process, thereby further reducing fabricating costs. Additionally, particles of photo-resist pattern generated during the fabricating process are removed, preventing contamination of the fabricating apparatus, and mitigating defects in the resulting thin film transistor array substrates.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a thin film transistor array substrate comprising:
    forming gate patterns including a gate line and a gate electrode on a substrate;
    forming a gate insulating layer on the substrate and the gate patterns;
    forming source/drain patterns including a data line, a source electrode, a drain electrode and a storage electrode on the gate insulating;
    depositing a passivation film on the gate insulating layer and the source/drain patterns;
    forming a photo-resist pattern on the passivation film, and patterning the passivation film and the gate insulating layer using the photo-resist pattern as a mask to form a passivation film pattern and a gate insulating pattern so that a portion of the substrate is exposed;
    depositing a transparent electrode material on the substrate and the photo-resist pattern; and
    removing the photo-resist pattern and the transparent electrode material deposited on the photo-resist pattern to form a transparent pattern including a pixel electrode so that the transparent pattern is non-overlapped with the passivation film pattern,
    wherein the removing the photo-resist pattern and the transparent electrode material including:
    dipping the substrate having the photo-resist pattern and the transparent electrode material in a first stripper to remove the photo-resist pattern and the transparent electrode material;
    removing a residual photo-resist pattern and a residual transparent electrode material left on the substrate by jetting air to the substrate by using an air knife after dipping the substrate in the first stripper; and
    removing particles of the residual photo-resist pattern and the residual transparent electrode material left on the substrate by jetting a second stripper to the substrate by using a jet nozzle after removing the residual photo-resist pattern and the residual transparent electrode material.

2. The method according to claim 1, wherein the jetting a second stripper includes jetting the second stripper at the temperature of at least approximately 70° C.

3. The method according to claim 1, wherein the jetting a second stripper includes jetting the second stripper under a pressure of at least approximately 1 kg/cm$^2$.

* * * * *